United States Patent [19]
Sin

[11] Patent Number: 5,130,564
[45] Date of Patent: Jul. 14, 1992

[54] SIGNAL DELAY CIRCUIT FOR MINIMIZING THE DELAY TIME DEPENDENCE ON POWER SUPPLY VOLTAGE VARIATION

[75] Inventor: Yun-Seung Sin, Kyunggi-do, Rep. of Korea

[73] Assignee: Samsung Electronics Co., Ltd., Kyunggi-do, Rep. of Korea

[21] Appl. No.: 620,720

[22] Filed: Dec. 3, 1990

[30] Foreign Application Priority Data

Jul. 20, 1990 [KR] Rep. of Korea .................. 90-11076

[51] Int. Cl.⁵ .............................................. H03K 5/01
[52] U.S. Cl. .................................. 307/246; 307/304; 307/443; 307/542; 307/572
[58] Field of Search ............... 307/246, 304, 443, 542, 307/482, 578, 572, 590, 591, 592

[56] References Cited

U.S. PATENT DOCUMENTS

| | | | |
|---|---|---|---|
| 4,334,324 | 6/1982 | Hoover | 307/304 |
| 4,649,289 | 3/1987 | Nakano | 307/246 |
| 4,791,321 | 12/1988 | Tanaka et al. | 307/304 |
| 4,792,705 | 12/1988 | Ouyang et al. | 307/246 |
| 5,013,932 | 5/1991 | Smith | 307/264 |

Primary Examiner—Stanley D. Miller
Assistant Examiner—Scott A. Ouellette
Attorney, Agent, or Firm—Cushman, Darby & Cushman

[57] ABSTRACT

A signal delay circuit includes a driving circuit for driving an output signal with a voltage swing voltage between a supply voltage and a ground voltage. The signal delay circuit further includes a varactor load which is coupled to the output signal and has a capacitance which increases according to the supply voltage within a variation range of the supply voltage. The varactor load keeps the delay characteristic of the signal propagation circuit independent of the change of the supply voltage, thereby ensuring high speed operation and improved reliability of the CMOS semiconductor integrated circuit.

13 Claims, 10 Drawing Sheets

FIG. IC (PRIOR ART)

FIG. 6A
FIG. 6B
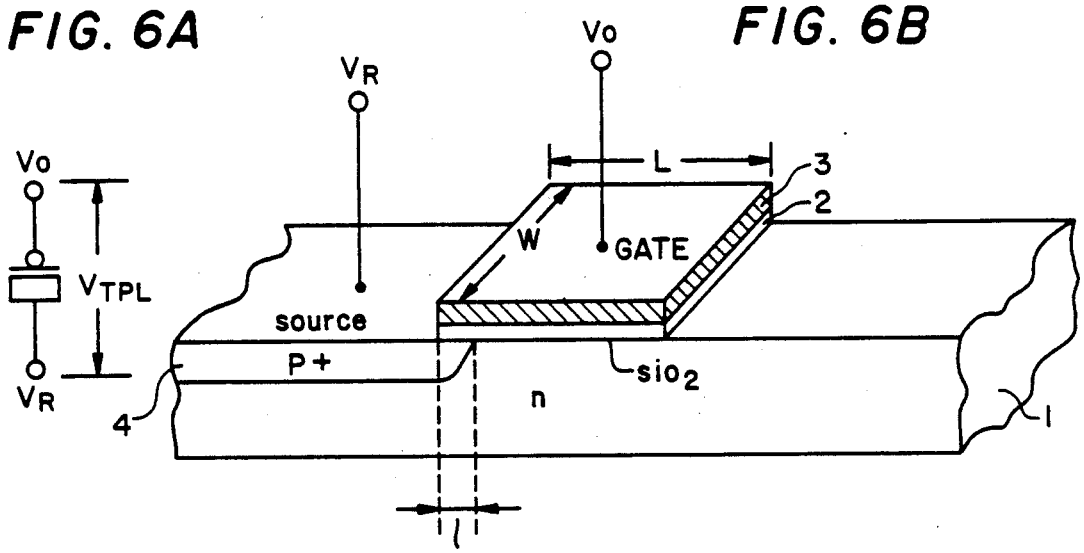
FIG. 6C
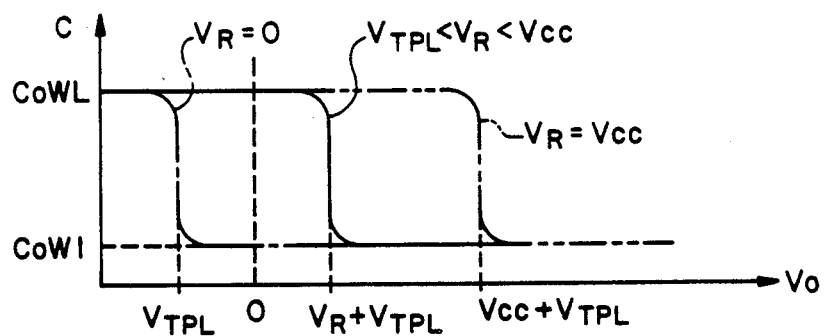
FIG. 7A
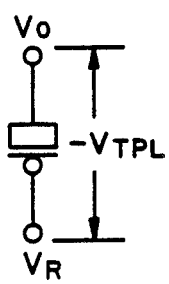
FIG. 7B
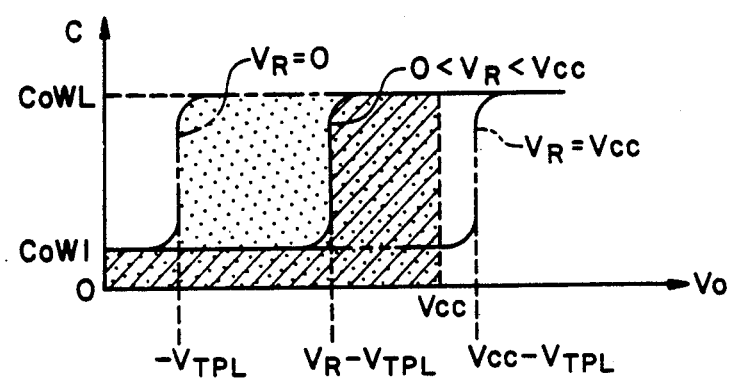

$|V_{TPL1}| \neq |V_{TP}|$  $|V_{TPL2}| = |V_{TP}|$ $|V_{TPL}| \neq |V_{TP}|$  $V_{TNL} = V_{TN}$

SIGNAL DELAY CIRCUIT FOR MINIMIZING THE DELAY TIME DEPENDENCE ON POWER SUPPLY VOLTAGE VARIATION

FIELD OF THE INVENTION

The present invention relates to a signal delay circuit, and more particularly, to the signal delay circuit of a CMOS semiconductor integrated circuit chip.

BACKGROUND OF THE INVENTION

Generally, a circuit system integrated on a semiconductor chip is operated by receiving a supply voltage Vcc from the outside. A CMOS semiconductor chip usually employs a single voltage of 5V as the supply voltage Vcc. However, in CMOS semiconductor chip, although the supply voltage in the range of Vcc±5% is given as the operating voltage, the operating voltage is substantially in the range of 4V to 6V.

Usually, the circuit system of CMOS semiconductor chip includes a signal delay circuit to achieve a special purpose of circuit. The signal delay circuit has a predetermined delay time by using a signal propagation delay time of the gate. For instance, a CMOS signal delay circuit using CMOS inverters is illustrated in FIG. 1A. This circuit comprises a first CMOS inverter DRV to drive a capacitive load CL according to an input signal VIN, and a second CMOS inverter BTT as a buffer amplifier for buffering and outputting a terminal voltage signal Vo of the capacitive load CL.

The terminal voltage signal Vo of the capacitive load CL has the delay characteristic according to the input signal VIN as shown in FIG. 1B. In detail, the capacitive load CL is discharged to ground voltage Vss or GND through pull-down NMOS transistor NM of the first CMOS inverter DRV, and is charged with the supply voltage Vcc through the pull-up PMOS transistor PM. Therefore, the delay time Td is determined by the voltage fall time Tf and the voltage rise time Tr according to the following equation:

$$Td = \frac{1}{4}(Tf + Tr) \quad (1)$$

Here, on the assumption that the threshold voltages VTN and VTP are approximately 0.2 Vcc and the current driving capabilities $\beta$ N and $\beta$ P of the MOS transistors NM and PM are equal to one another, the above equation (1) can be rewritten as the following equation:

$$Td = \frac{2CL}{\beta \, Vcc} \quad (2)$$

Referring to the above equation (2), it is known that the delay time Td is proportional to the capacitance of the capacitive load CL and inversely proportional to the supply voltage Vcc.

Accordingly, if the capacitance of the capacitive load CL is set to a fixed value, the delay time Td, as shown in FIG. 1C, varies according to the fluctuation of the supply voltage Vcc. In more detail, the delay time Td lengthens at low Vcc, and the delay time Td shortens at high Vcc.

But, since the conventional CMOS signal delay circuit keeps a constant load capacitance in the range of the operating voltage of the supply voltage Vcc, e.g., in 4V~6V, the operating speed of the overall circuit system is determined at low Vcc, so that the signal delay circuit becomes an impediment to the high operating speed. Also, since longer delay time is required at the high Vcc to prevent the occurrence of the race problem of the signal operating characteristic resulting from the difference between the delay characteristic of one part of the circuit and that of the other part of the circuit, the delay time becomes much longer to satisfy the above requirement, so that high speed operation of the overall chip is prevented.

Thus, a circuit having a predetermined delay time, which is independent of the change of the supply voltage, is earnestly required. If this requirement can be satisfied, the circuit delay at low Vcc becomes equal to that at high Vcc, so that the operating velocity of the overall chip (determined especially by the low Vcc) is kept fast. Accordingly, the performance of the circuit system of semiconductor chip can be greatly improved.

SUMMARY OF THE INVENTION

Therefore, it is an object of the present invention to provide a signal delay circuit having a predetermined delay time characteristic regardless of the fluctuation of the supply voltage, to solve the problem of the conventional technique.

It is another object of the present invention to provide a signal delay circuit to improve the operating velocity of the semiconductor chip.

To achieve the above objects, the circuit according to the present invention comprises a driving circuit which is coupled between a supply voltage and a ground voltage and includes a pull-up PMOS transistor and a pull-down NMOS transistor having respective predetermined threshold voltages and commonly coupled drains. The driving circuit drives an output signal having a voltage swing between the supply voltage and the ground voltage to the common drain node in response to at least one input signal. The circuit further comprises a varactor load which is coupled to the common drain node and has a capacitance which increases according to the supply voltage within a variation range of the supply voltage.

BRIEF DESCRIPTION OF THE DRAWINGS

The above objects and other advantages of the present invention will become more apparent by describing the preferred embodiment of the present invention with reference to the attached drawings, in which:

FIG. 1C is a graphic representation illustrating the time delay characteristic according to the supply voltage of the circuit in FIG. 1A;

FIG. 6A is a symbolic representation of a MOS varactor;

FIG. 6B is a geometric representation of the MOS varactor shown in FIG. 6A;

FIG. 6C is a graphic representation of a C-V characteristic of the MOS varactor in FIG. 6A;

FIG. 7A is a symbolic representation of a PMOS varactor according to the present invention;

FIG. 7B is a graphic representation of a C-V characteristic of the PMOS varactor in FIG. 7A;

DETAILED DESCRIPTION OF THE INVENTION

First, the conventional signal delay circuit will be explained prior to describing the present invention.

Figure 1A:
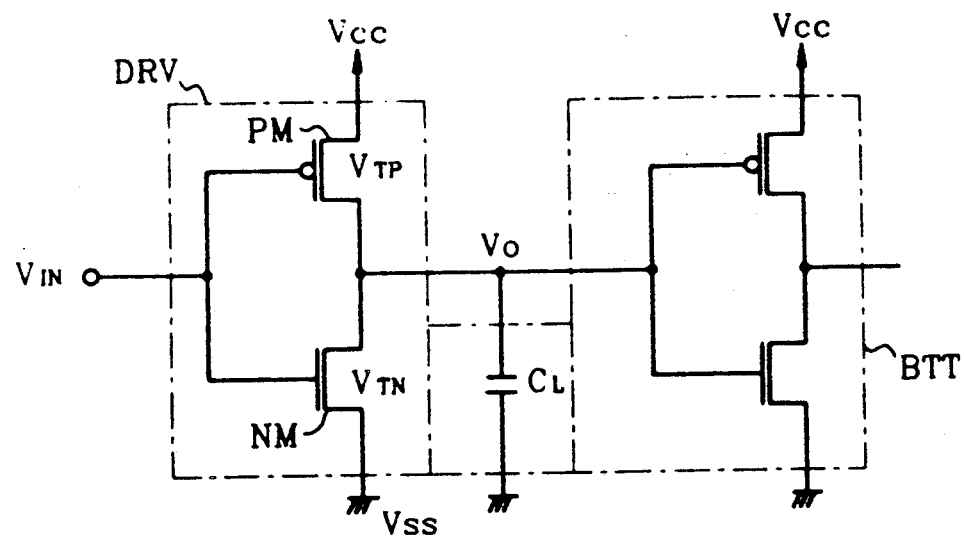
FIG. 1A is a circuit diagram of a conventional CMOS signal delay circuit.
Figure 1B:
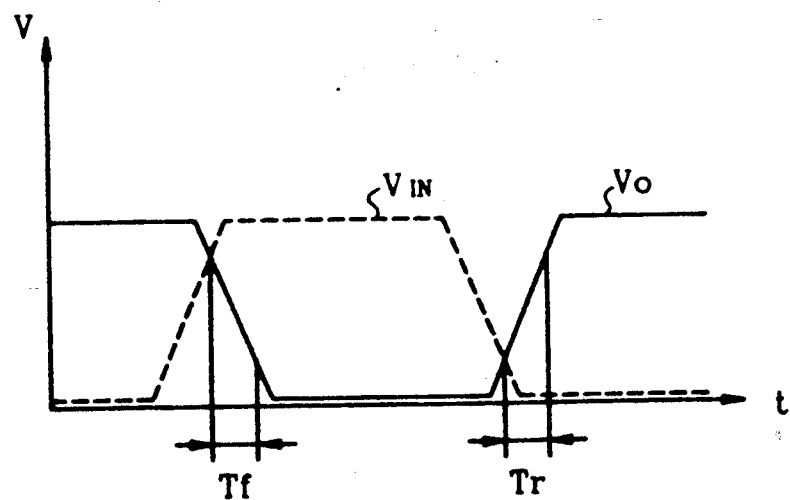
FIG. 1B is a signal wave form diagram showing an input and output wave form of the conventional CMOS signal delay circuit in FIG. 1.
Figure 2A:
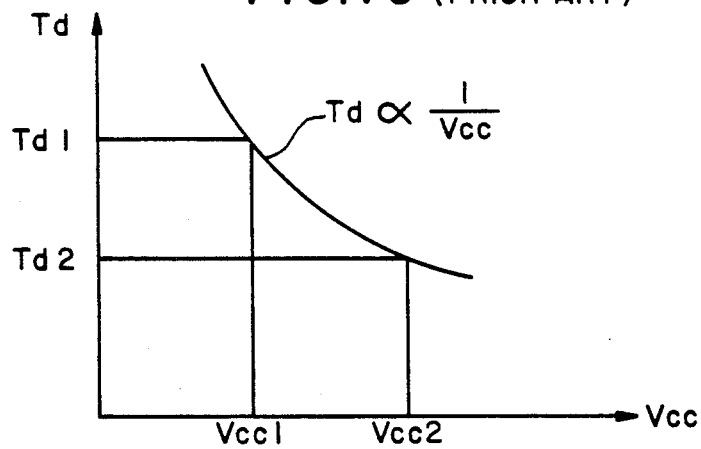
FIG. 2A is a circuit diagram of a CMOS signal delay circuit having a conventional NMOS capacitor.

FIG. 2A illustrates a conventional signal delay circuit consisting of a driving circuit DRV and a capacitor load CL. The driving circuit DRV consists of a CMOS inverter in which a pull-up PMOS transistor PM having a threshold voltage VTP and a pull-down NMOS transistor NM having a threshold voltage VTN are connected between the supply voltage Vcc and the ground voltage VSS or GND. An input signal VIN is applied to the gate electrodes of the transistors PM and NM, and the output signal Vo is driven at the common drain node according to the input signal VIN.

The capacitor load CL consists of an NMOS capacitor in which the gate electrode is connected to the common drain node of the transistors PM and NM, and the N+source electrode (or N+drain electrode) is connected to the ground voltage VSS. The threshold voltage VTNL of the NMOS capacitor generally has the same value as the threshold voltage VTN of the pull-down NMOS transistor NM of the driving circuit DRV (i.e. VTNL=VTN).

Figure 2A:
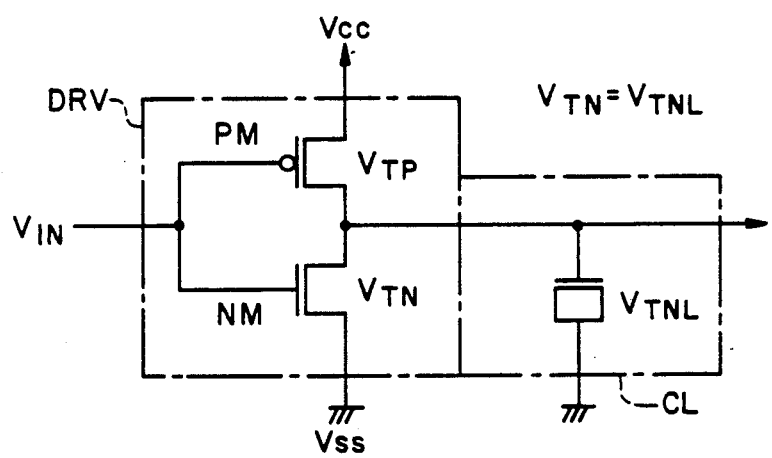
Figure 2B:
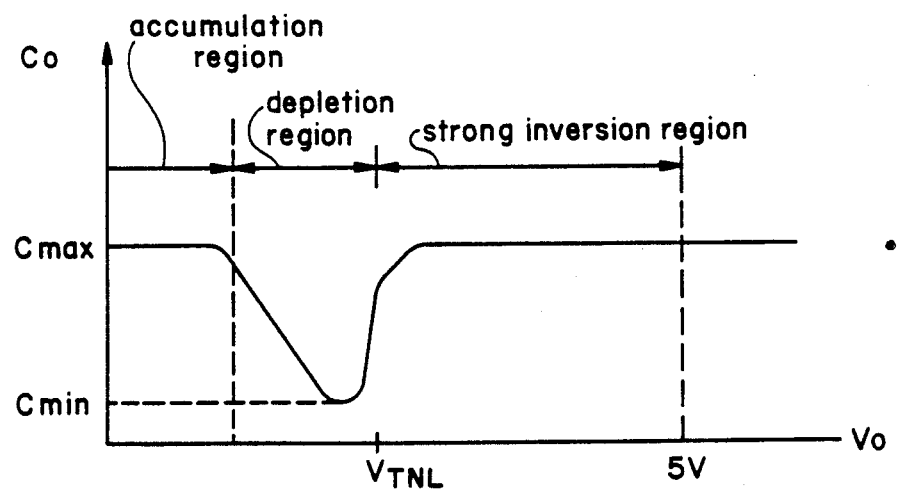
FIG. 2B illustrates the C-V characteristic of the NMOS capacitor of the circuit shown in FIG. 2A.

The C-V characteristic curve of this signal delay circuit is shown in FIG. 2B. The NMOS capacitor has a strong inversion capacitance value in a region where the output voltage Vo is larger than the threshold voltage VTNL=VTN, and has a depletion capacitance value in a region where the output voltage Vo is smaller than the threshold voltage VTNL=VTN. Thus, within the fluctuation range of the supply voltage Vcc of 4V~6V, for example, the NMOS capacitor maintains a strong inversion capacitance value at the supply voltage Vcc of 5V. Therefore, in spite of the fluctuation of the supply voltage Vcc, the NMOS capacitor has a constant capacitance value within most of the voltage region, so that the signal delay time is longer at low Vcc and is shorter at high Vcc. The delay time varies according to the above fluctuation of supply voltage so that high speed operation of the circuit system is limited.

Figure 3A:
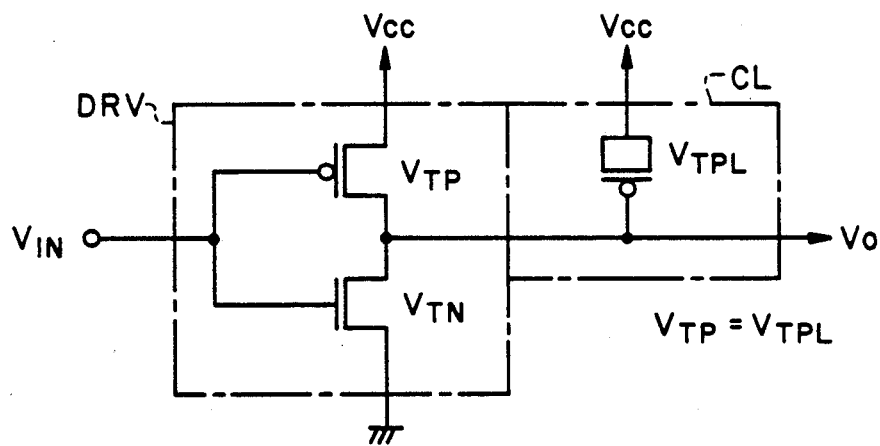
FIG. 3A is a circuit diagram of a CMOS signal delay circuit having a conventional PMOS capacitor.
Figure 3B:
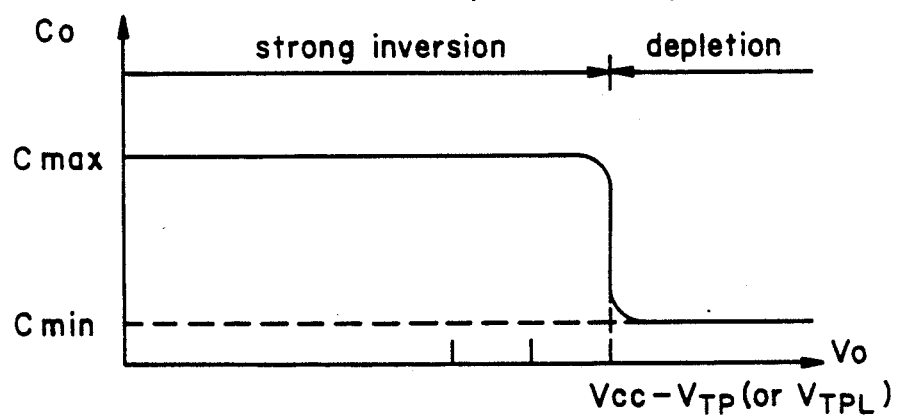
FIG. 3B illustrates a C-V characteristic of the PMOS capacitor of the circuit shown in FIG. 3A.

The circuit in FIG. 3A is different from that of FIG. 2 in that the capacitor load CL consists of a PMOS capacitor. The gate electrode of this PMOS capacitor is connected to the common drain node of the driving circuit DRV and P+source electrode (or P+drain electrode) is connected to the supply voltage Vcc. In FIG. 3B, the C-V characteristic curve of the circuit in FIG. 3A shows that the strong inversion capacitance value is kept at a constant value within most of the voltage region, as in the circuit of FIG. 2A.

Figure 4A:
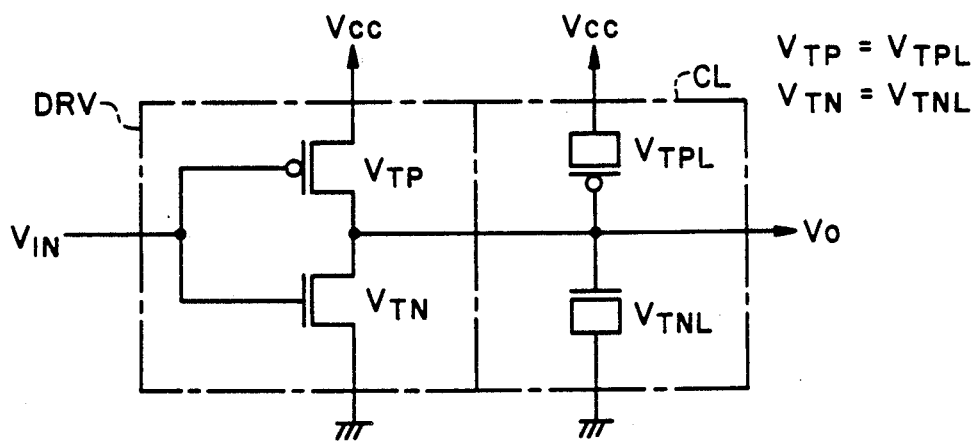
FIG. 4A is a circuit diagram of a CMOS signal delay circuit having the conventional NMOS and PMOS capacitors.
Figure 4B:
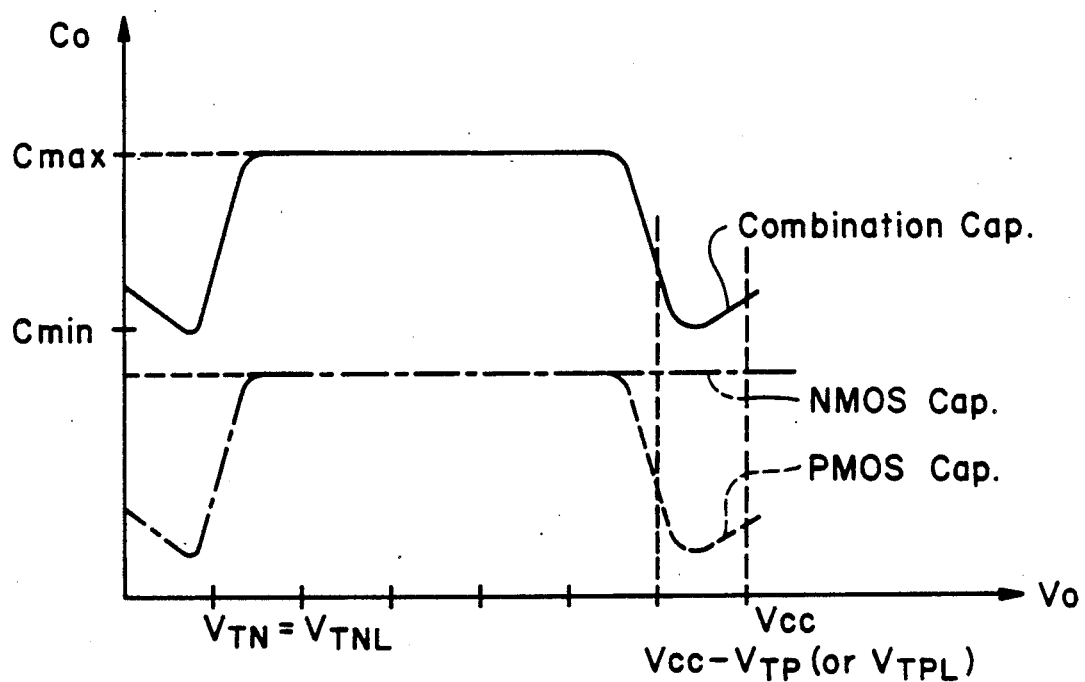
FIG. 4B illustrates a C-V characteristic of the circuit shown in FIG. 4A.

FIG. 4A shows a combined circuit which combines the NMOS capacitor of FIG. 2A and the PMOS capacitor of FIG. 3A. Referring to FIG. 4B, the C-V characteristic curve of the circuit in FIG. 4A has the combined characteristics of both characteristic curves of MOS transistors (shown separately in FIGS. 2B and 3B), and the load capacitance of the combined circuit is equivalent to the summation of the strong inversion capacitance values of the NMOS and PMOS capacitors. The circuit shown in FIG. 4A has a larger load capacitance value than those of the circuits in FIG. 2A and FIG. 3A. But, the circuit shown in FIG. 4A also keeps a certain load capacitance at most operation voltages within the fluctuation range of the supply voltage Vcc and regardless of the supply voltages Vcc.

Thus, the conventional signal delay circuit is constructed in such a manner that the threshold voltage of the driving circuit DRV and the MOS capacitor load CL is the same, so that, within the fluctuation range of the supply voltage Vcc, a constant load capacitance is kept with the result that the signal delay time is lengthened at low Vcc and is shortened at high Vcc. Therefore, the signal delay time changes according to the varying of the supply voltage Vcc resulting in a race problem at high Vcc. To prevent this problem, however, when the system is designed to maintain a predetermined delay time according to the operation condition at high Vcc, the delay time becomes longer at low Vcc, and the high speed operation of the overall circuit system is not achieved.

Next, preferred embodiments of the present invention will be explained.

Figure 5A:
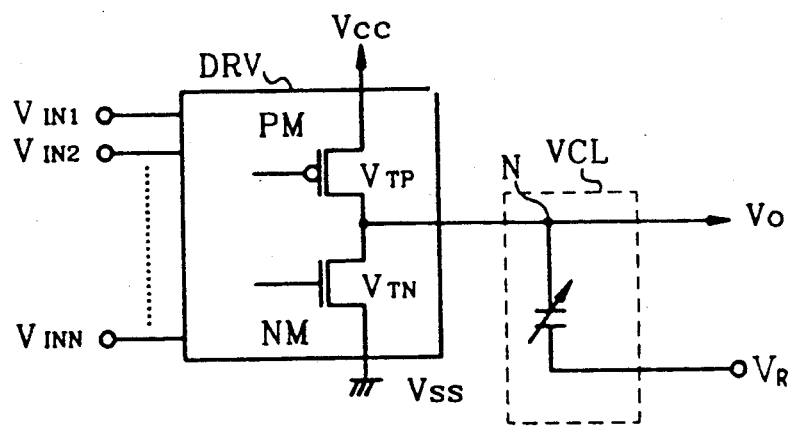
FIG. 5A is a circuit diagram of a preferred embodiment of the CMOS signal delay circuit according to the present invention.

FIG. 5A shows a signal delay circuit according to the present invention which comprises a driving circuit DRV and a varactor (i.e., voltage variable capacitor) load VCL. The driving circuit DRV comprises a pull-up PMOS transistor PM and a pull-down NMOS transistor NM between a first power voltage, such as a supply voltage Vcc, and a second power voltage, such as a ground voltage VSS or OV. The drain electrodes of transistors PM and NM are commonly connected at an output node N. In addition, this driving circuit DRV is driven by at least one input signal VIN1 through VINn to drive the output voltage Vo at the output node N through a voltage swing from the supply voltage Vcc to the ground voltage Vss.

The varactor load VCL consists a varactor which has one electrode connected to the output node N, and the other electrode connected to a reference voltage VR.

Figure 5B:
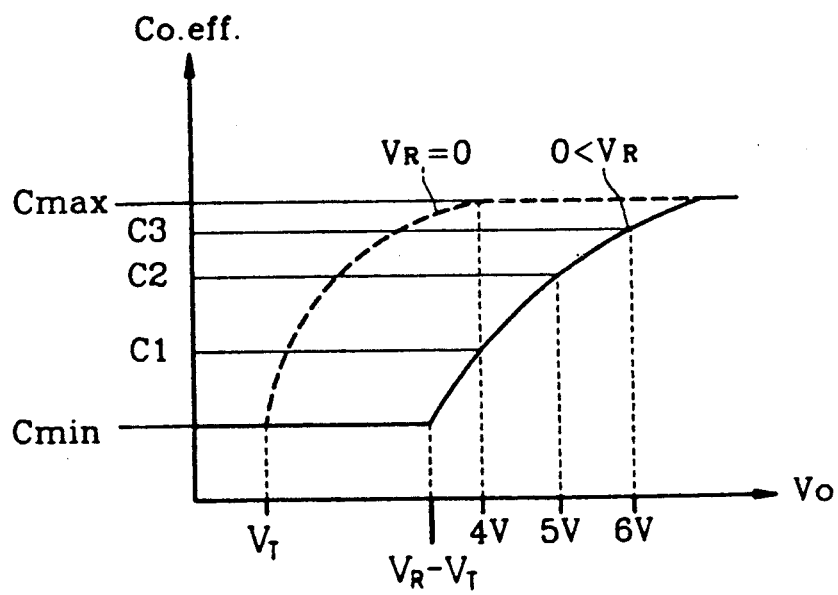
FIG. 5B illustrates a C-V characteristic graph of a varactor load of the circuit shown in FIG. 5A.

The above varactor has the characteristic curve of an effective capacitance (Co.eff.) versus the output voltage Vo as shown in FIG. 5B. In more detail, a minimum capacitance value is kept when the output voltage Vo is smaller than the summation of the reference voltage VR and the threshold voltage VT of the varactor, and the capacitance value increases according to the output voltage Vo when the output voltage is larger than the summation.

Thus, when the output voltage Vo is driven at the level of the supply voltage Vcc, the effective capacitance value of the varactor increases according to the fluctuation of the supply voltage Vcc. Thus, it has the effective capacitance C1 at low Vcc, such as 4V, and has the effective capacitance C3 at high Vcc, such as 6V.

The varactor having such C-V characteristic can consist of a PMOS or an NMOS capacitor, or a combination of these.

FIG. 6A and FIG. 6B are a symbolic representation and a geometric representation of a PMOS varactor, respectively. Referring to FIG. 6B, the PMOS varactor has a gate electrode layer 3 of a certain width W and a certain length L formed on the n-type silicon substrate 1 and insulated by the SiO$_2$ gate insulating film 2. A P+source electrode layer 4 (or P+drain electrode layer) is formed by doping with P+ion the p-type silicon substrate 1 to one side of the gate electrode layer 3 by using the gate electrode layer 3 as a mask. The gate electrode layer 3 overlaps the P+source electrode layer 4 by a predetermined length l as a result of side diffusing of the ion doped on the silicon substrate 1.

This PMOS varactor has a predetermined threshold voltage VTPL based on such factors including the impurity concentration in channel region, and the thickness and the dielectric constant of the gate insulating film 2.

Thus, the PMOS varactor has the C-V characteristic curve as shown in FIG. 6C. In more detail, when the output voltage Vo is applied to the gate electrode 3 and the reference voltage VR is applied to the P+source electrode layer 4, the capacitance C between the gate and the source is as follows:

| | |
|---|---|
| C = Co Wl, | when Vo > VR + VTPL |
| C = Co WL, | when Vo < VR + VTPL. |

Accordingly, when the reference voltage VR is OV, the capacitance value is determined based on the overlapped area WL of the gate electrode layer and source electrode layer when the output voltage Vo is below the threshold voltage VTPL, and based on the whole area of WL of gate electrode layer when the output voltage Vo is above the threshold voltage VTPL. The transition of the above capacitance value occurs below 1 volt.

Thus, the voltage value at which the transition of the capacitance value occurs can be controlled according to the value of the reference voltage VR.

However, in the PMOS varactor, the capacitance value decreases above the voltage at which the transition occurs, and increases below the transition voltage, so that it is inappropriate for the varactor load VCL to achieve the object of the present invention.

FIG. 7A shows a connection wherein the output voltage Vo is supplied to P+source electrode layer 4 and the reference voltage VR is supplied to the gate electrode layer 3, which is opposite to that of FIG. 6A. The C-V characteristic curve of this connection is shown in FIG. 7B and has the C-V characteristic required in the present invention. That is, the capacitance value increases above the voltage at which the transition occurs, and decreases below the transition voltage.

Figure 8A:
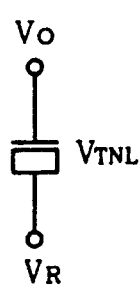
FIG. 8A is a symbolic representation of an NMOS varactor according to the present invention.

FIG. 8A is a symbolic representation of an NMOS varactor. In the NMOS varactor, the gate electrode is connected to the output voltage Vo and the N+source electrode is connected to the reference voltage VR. Thus, the NMOS varactor has a strong inversion capacitance value Co WL when the output voltage Vo is higher than the summation of the reference voltage VR and the threshold voltage VTNL, and has the overlap capacitance value Co Wl when the output voltage Vo is lower than the summation. Thus, the structure of the connection in FIG. 8A has the C-V characteristic required in the present invention.

Figure 9A:
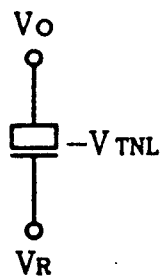
FIG. 9A is a symbolic representation of another NMOS varactor wherein connections of terminal voltages of the MOS capacitor are opposite to those of FIG. 8A.
Figure 9B:
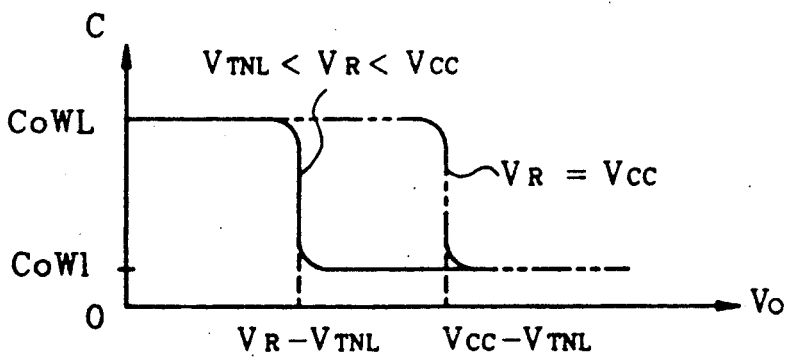
FIG. 9B is a graphic representation of a C-V characteristic of the NMOS varactor in FIG. 9A.
Figure 10A:
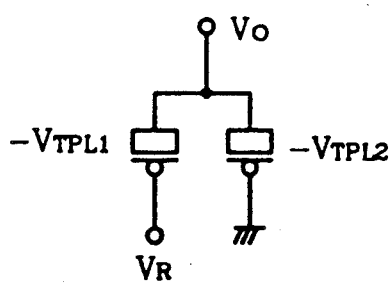
FIGS. 10A, 11A, 12A and 13A are symbolic illustrations showing preferred embodiments of varactor load combinations according to the present invention.
Figure 10B:
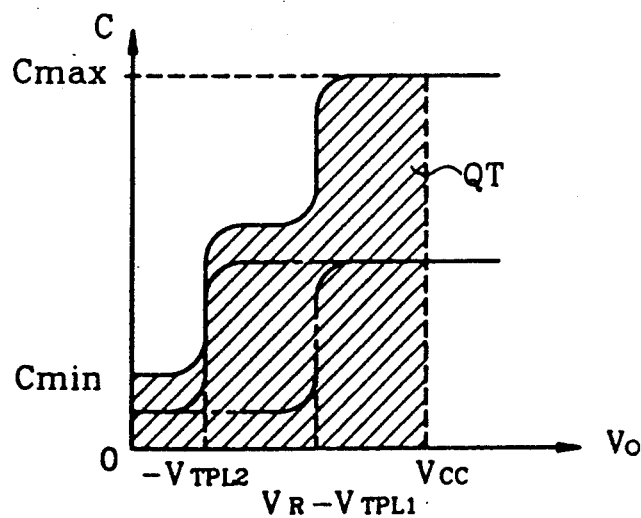
FIGS. 10B, 11B, 12B and 13B are graphic representations showing the respective C-V characteristics of the varactor load combinations in FIGS. 10A, 11A, 12A and 13A.
Figure 11A:
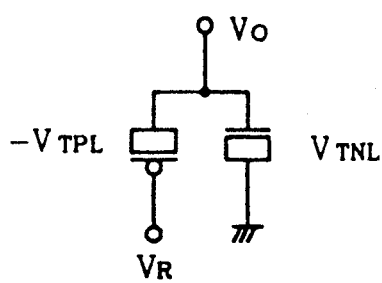
Figure 11B:
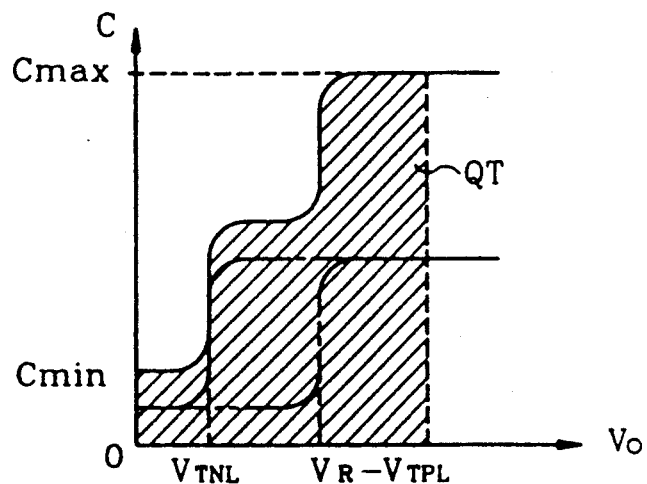
Figure 12A:
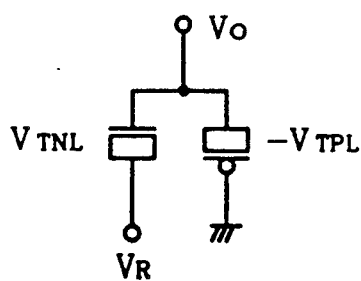
Figure 12B:
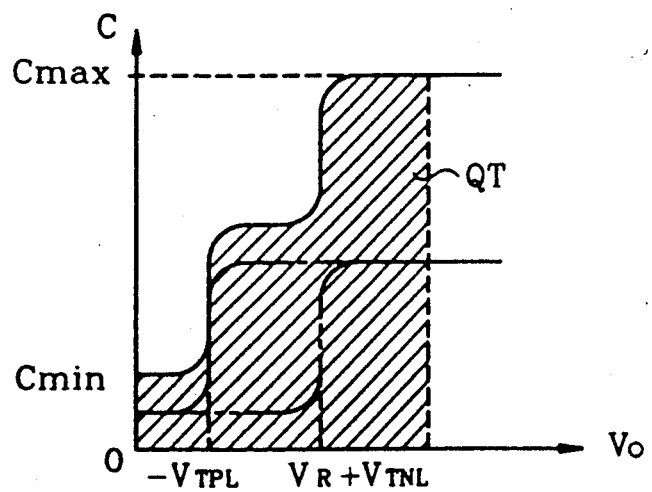
Figure 13A:
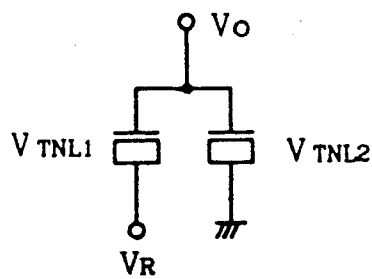
Figure 13B:
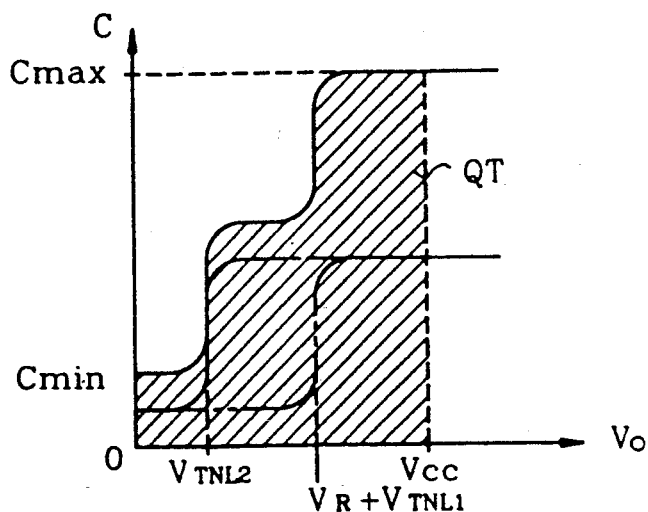

FIG. 9A is a symbolic representation of another NMOS varactor in which the reference voltage VR is connected to gate electrode and output voltage Vo is connected to N+source electrode. The C-V characteristic curve of NMOS varactor shown in FIG. 9A is illustrated in FIG. 9B. The C-V characteristic of the NMOS varactor is not one desired the present invention. That is, the capacitance value decreases above the voltage at which the transition occurs, and increases below the transition voltage.

Thus, the PMOS varactor of FIG. 7A or the NMOS varactor of FIG. 8A, having the desired C-V characteristic in the present invention, is adopted as the varactor load VCL. Referring to the C-V characteristic curve of FIG. 7B or FIG. 8B, the effective capacitance (Co.eff.) of the varactor load VCL is calculated as follows.

Figure 8B:
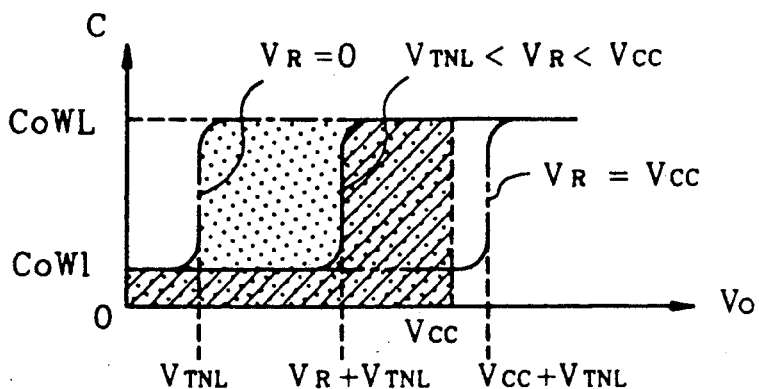
FIG. 8B is a graphic representation of the C-V characteristic of the NMOS varactor in FIG. 8B.

In the case that the output voltage Vo fully swings within OV~Vcc, the total electric charge amount used in the change of the output voltage at the driving transistor is given by the following equation:

$$QT = \int_0^{Vcc} C_0(V_0) \cdot dV_0,$$

and is proportional to the area having oblique lines of FIG. 7B or FIG. 8B. Accordingly, the effective load capacitance (Co.eff.) is determined by the following equation:

$$Co.\mathit{eff}. = \frac{1}{Vcc} \int_0^{Vcc} C_0(V_0) \cdot dV_0 = \frac{QT}{Vcc},$$

That is, the effective load capacitance (Co.eff.) is proportional to the total electric charge amount QT which is the integral of the output voltage Vo. Thus, by properly setting the reference voltage VR, the effective load capacitance which increases according to the output voltage Vo within the fluctuation range of the supply voltage Vcc is obtained as indicated by the solid line in FIG. 5B. But, since the varactor load VCL of said FIG. 7A or FIG. 8A becomes smaller than Cmax in the case of low Vcc, the delay time of the signal delay circuit becomes shorter. As a result, the longer predetermined delay time can not be obtained.

FIGS. 9A, 10A, 11A, 12A and 13A illustrate several preferred embodiments of the present invention having a varactor load consisting of a combination of the PMOS and NMOS varactors to obtain a sufficient effective load capacitance.

As shown in FIGS. 9B, 10B, 11B, 12B and 13B, the combination varactor loads keep a constant effective load capacitance value at low Vcc, so that the desired delay time is obtained. Here, the PMOS varactor connected between the output terminal N and the ground may have a threshold voltage VTPL equal to, or different from, the threshold voltage VTP of the PMOS transistor PN of the driving circuit DRV. That is, the C-V characteristic desired in the present invention is kept under one of the following conditions:

$$VTPL = VTP \text{ or } VTPL \neq VTP$$

However, since the NMOS varactor connected between the output terminal N and ground is in an accumulation state in the region below the threshold voltage VTNL when it is designed to have a larger threshold voltage VTNL than the threshold voltage VTN of the NMOS transistor NM of the driving circuit DRV, the NMOS varactor has an accumulation capacitance value larger than the Cmin value, so that the C-V characteristic desired in the present invention can not be obtained.

Figure 14A:
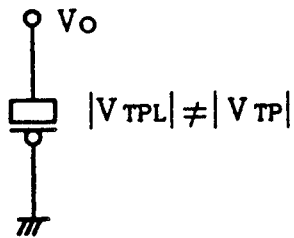
FIG. 14A is a symbolic illustration of a modified preferred embodiment of a load according to the present invention.
Figure 14B:
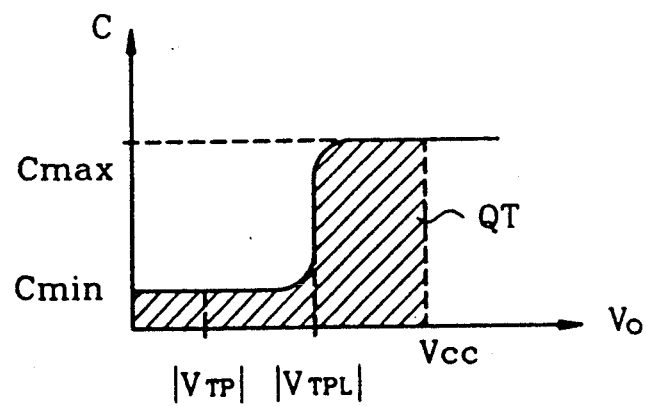
FIG. 14B is a graphic representation of the C-V characteristic of the load in FIG. 14A.

Referring to FIG. 14A, the varactor load VCL consists of a PMOS varactor, in which the P+source electrode is connected to the output voltage Vo and the gate electrode is connected to the ground voltage VSS, and which has a threshold voltage VTPL greater than the threshold voltage VTP of the PMOS transistor PM of the driving circuit DRV. The PMOS varactor of FIG. 14A has a C-V characteristic curve desired in the present invention as shown FIG. 14B. That is, the effective load capacitance increases according to the output voltage Vo within the fluctuation range of the supply voltage Vcc and varies according to the value of the threshold voltage VTPL. Thus, in the case of using the PMOS varactor of FIG. 14A, the supply of the extra reference voltage VR required in previous embodiments is not necessary.

Figure 15A:
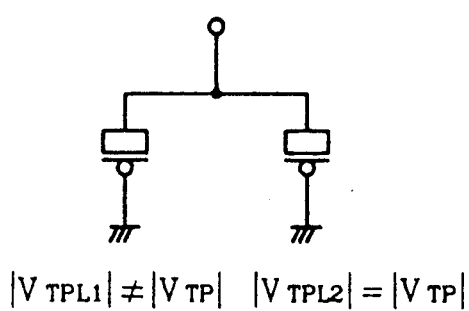
FIG. 15A and FIG. 16A are symbolic illustrations of other modified preferred embodiments of the varactor load combinations according to the present invention.
Figure 16A:
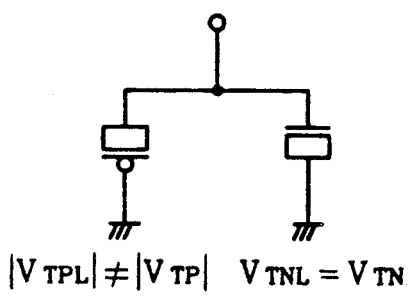

FIGS. 15A and 16A illustrate combination varactor loads in which an extra PMOS varactor and an extra varactor are respectively added in parallel to the varactor load of FIG. 14A to keep the constant effective load capacitance even at low Vcc.

Figure 15B:
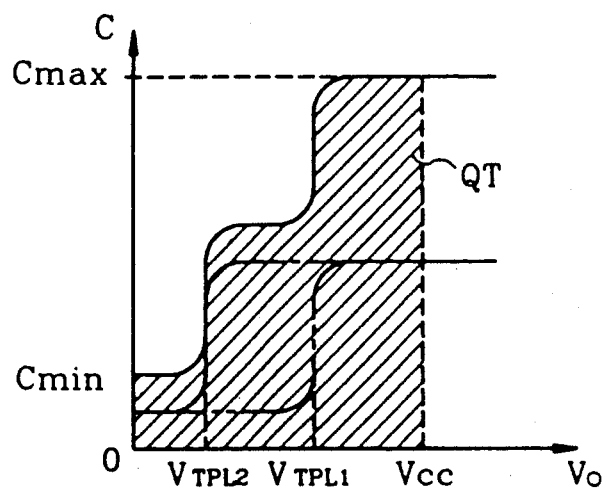
FIG. 15B and FIG. 16B are graphic representations of the respective C-V characteristics of the varactor load combinations in FIG. 15A and FIG. 16A.
Figure 16B:
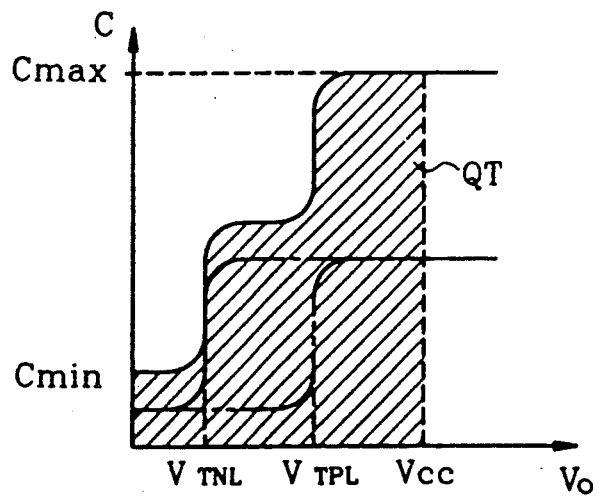

FIGS. 15B and 16B show the respective C-V characteristic curves of the combination varactor loads. In these cases, the threshold voltage of the PMOS varactor may increase the capacitance at low Vcc without limitation, but it is desirable for the threshold voltage VTNL of the NMOS varactor to be set no higher than the threshold voltage VTN of the NMOS transistor NM of the driving circuit DRV.

As described above, to solve the problem that the delay characteristic of the signal propagation circuit adapted in the CMOS semiconductor integrated circuit depends on the change of the supply voltage with the result that the operating speed is limited, the present invention employs a MOS varactor or a combination of MOS varactors to keep the delay characteristic of the signal propagation circuit independent of the change of the supply voltage and to obtain high speed operation and improve reliability of the CMOS semiconductor integrated circuit.

What is claimed is:

1. A signal delay circuit comprising:
   driving circuit means, which is coupled between a supply voltage and a first reference voltage and includes a pull-up PMOS transistor and a pull-down NMOS transistor having respective predetermined threshold voltages, for driving an output signal having a voltage swing between said supply voltage and said first reference voltage to a common drain node of said transistors in response to at least one input signal; and
   varactor load means coupled to said common drain node, having a capacitance which increases according to the increase of said output signal voltage of said common drain node within a variation range from the threshold voltage of said pull-down NMOS transistor to said supply voltage.

2. A signal delay circuit as claimed in claim 1, wherein said varactor load means comprises a MOS varactor coupled between said output signal of said common drain node and a second reference voltage.

3. A signal delay circuit as claimed in claim 2, wherein said MOS varactor comprises a PMOS varactor having a P+ source electrode coupled to said output signal and a gate electrode coupled to said second reference voltage.

4. A signal delay circuit as claimed in claim 2, wherein said MOS varactor comprises an NMOS varactor having an N+ source electrode coupled to said second reference voltage, and a gate electrode coupled or said output signal.

5. A signal delay circuit as claimed in claim 3, wherein said MOS varactor further comprises a second PMOS varactor having a P+ source electrode coupled to said output signal and a gate electrode coupled to said first reference voltage.

6. A signal delay circuit as claimed in claim 3, wherein said MOS varactor further comprises an NMOS varactor having a gate electrode coupled to said output signal and an N+source electrode coupled to said first reference voltage, and having a threshold voltage which is not significantly higher than the threshold voltage of said pull-down NMOS transistor.

7. A signal delay circuit as claimed in claim 4, wherein said MOS varactor further comprises a PMOS varactor having a P+source electrode coupled to said output signal and a gate electrode coupled to said first reference voltage.

8. A signal delay circuit as claimed in claim 4, wherein said MOS varactor further comprises a second NMOS varactor having a gate electrode coupled to said output signal and an N+source electrode coupled to said first reference voltage, and having a threshold voltage which is not significantly higher than the threshold voltage than said pull-down NMOS transistor.

9. A signal delay circuit as claimed in one of claims 2-8, wherein said second reference voltage has a voltage value between said supply voltage and said first reference voltage.

10. A signal delay circuit comprising
driving circuit means, which is coupled between a supply voltage and a first reference voltage and includes a pull-up PMOS transistor and a pull-down NMOS transistor having respective predetermined threshold voltages, for driving an output signal having a voltage swing between said supply voltage and said first reference voltage to a common drain node of said transistors in response to at least one input signal; and
varactor load means including a PMOS varactor having a P+source electrode coupled to said output signal applied to said common drain node and a gate electrode coupled to said first reference voltage.

11. A signal delay circuit as claimed in claim 10, wherein said varactor load means further comprises a second PMOS varactor having a P+source electrode coupled to said output signal and a gate electrode coupled to said first reference voltage, and having a threshold voltage equal to the threshold voltage of said pull-up PMOS transistor of said driving circuit means.

12. A signal delay circuit as claimed in claim 10, wherein said varactor load means further comprises an NMOS varactor having a gate electrode coupled to said output signal and an N+source electrode coupled to said first reference voltage, and having a threshold voltage equal to the threshold voltage of said pull-down NMOS transistor of said driving circuit means.

13. A signal delay circuit as claimed in claim 10, wherein the threshold voltage of said PMOS varactor is lower then the threshold voltage of said pull-up PMOS transistor of said driving circuit means.

* * * * *